US008225174B2

(12) United States Patent
Okamura

(10) Patent No.: US 8,225,174 B2
(45) Date of Patent: Jul. 17, 2012

(54) DECODING DEVICE AND DECODING METHOD

(75) Inventor: Toshihiko Okamura, Tokyo (JP)

(73) Assignee: NEC Corporation, Tokyo (JP)

( * ) Notice: Subject to any disclaimer, the term of this patent is extended or adjusted under 35 U.S.C. 154(b) by 624 days.

(21) Appl. No.: 12/517,979

(22) PCT Filed: Dec. 5, 2007

(86) PCT No.: PCT/JP2007/073466
§ 371 (c)(1),
(2), (4) Date: Jun. 5, 2009

(87) PCT Pub. No.: WO2008/069231
PCT Pub. Date: Jun. 12, 2008

(65) Prior Publication Data
US 2010/0017677 A1     Jan. 21, 2010

(30) Foreign Application Priority Data
Dec. 7, 2006   (JP) .................................. 2006-330924

(51) Int. Cl.
    *H03M 13/00* (2006.01)
(52) U.S. Cl. ...................................... 714/758; 714/752
(58) Field of Classification Search .................. 714/752, 714/758
See application file for complete search history.

(56) References Cited

U.S. PATENT DOCUMENTS

| 6,633,856 | B2 * | 10/2003 | Richardson et al. ............ 706/15 |
| 2004/0034828 | A1 | 2/2004 | Hocevar | |
| 2007/0162816 | A1 * | 7/2007 | Kim et al. ..................... 714/752 |

FOREIGN PATENT DOCUMENTS

| JP | 2002033670 A | 1/2002 |
| JP | 2004186940 A | 7/2004 |
| JP | 2004531972 A | 10/2004 |

OTHER PUBLICATIONS

International Search Report for PCT/JP2007/073466 mailed Feb. 26, 2008.
D. J. C. Macky, "Good Error-Correcting Codes Based on Very Sparse Matrices". IEEE Transactions on Information Theory, vol. 45, No. 2, p. 399-431, Mar. 1999.
Y. Chen et al., "A FPGA and ASIC Implementation of Rate 1/2, 8088-b Irregular Low Density Parity Check Decoder", IEEE, GLOBECOM 2003, p. 113-117, 2003.

* cited by examiner

*Primary Examiner* — Sam Rizk

(57) ABSTRACT

To provide a decoder capable of efficiently dealing with various Z, even when in-block parallel degree is fixed in MP decoding of quasi-cyclic LDPC codes. A reception value aligning device keeps the first S or less reception value data from the block head. If block size Z is not a multiple of S, (S−(Z mod S)) data of the block head are added to the end of the reception value data of the block so that the block size Z is a multiple of S. The block size is written into reception value memory. A message aligning device performs cyclic permutation. If Z is not a multiple of S, the first (S−(Z mod S)) messages from the block output head are added to the end of the output message of the block so that the Z is a multiple of S and is outputted to the message memory.

9 Claims, 14 Drawing Sheets

| | CYCLE 0 | CYCLE 1 | CYCLE 2 | CYCLE 3 | CYCLE 4 |
|---|---|---|---|---|---|
| INPUT | 0 1 2 3 4 | 5 6 7 8 9 | 10 11 0 12 | | |
| REGISTER 802 | | 0 1 2 3 4 | 0 1 2 3 4 | 5 6 7 8 9 | |
| REGISTER 803 | | | 5 6 7 8 9 | 10 11 0 12 | |
| REGISTER 804 | | 0 1 2 3 4 | 0 1 2 3 4 | 0 1 2 3 4 | |
| ADDRESS | | | 2 | 0 | 1 |
| OUTPUT REGISTER | | | | 1 2 3 4 5 | 3 4 5 6 7 | 8 9 10 11 0 |

GAP PROCESSING

FIG. 1

$$H = \begin{pmatrix} \cdots 0\,1\,0 \cdots 0\,1\,0 \cdots 0\,1\,0 \cdots 0\,1\,0 \cdots \\ \phantom{\cdots 0\,}1\phantom{\,0} \\ \phantom{\cdots 0\,}1 \end{pmatrix} \begin{matrix} i(0) \\ \\ i(1) \\ \\ i(2) \end{matrix}$$

with columns labeled $j(0), j(1), j(2), j(3)$ (ROW $j$) and COLUMN $i$ indicated at $j(1)$.

ROW PROCESSING
cv(j, j(1)) ← F(vc(j(0), j), vc(j(2), j), vc(j(3), j))

COLUMN PROCESSING
vc(i, i(0)) ← r(i) + cv(i(1), i) + cv(i(2), i)

BIT JUDGMENT
if r(i) + cv(i(0), i) + cv(i(1), i) + cv(i(2), i) > 0, then
    bit i = 0.
else
    bit i = 1.
end if.

$$I(0) = \begin{pmatrix} 1 & 0 & 0 & 0 & 0 \\ 0 & 1 & 0 & 0 & 0 \\ 0 & 0 & 1 & 0 & 0 \\ 0 & 0 & 0 & 1 & 0 \\ 0 & 0 & 0 & 0 & 1 \end{pmatrix} \quad I(1) = \begin{pmatrix} 0 & 1 & 0 & 0 & 0 \\ 0 & 0 & 1 & 0 & 0 \\ 0 & 0 & 0 & 1 & 0 \\ 0 & 0 & 0 & 0 & 1 \\ 1 & 0 & 0 & 0 & 0 \end{pmatrix} \quad I(2) = \begin{pmatrix} 0 & 0 & 1 & 0 & 0 \\ 0 & 0 & 0 & 1 & 0 \\ 0 & 0 & 0 & 0 & 1 \\ 1 & 0 & 0 & 0 & 0 \\ 0 & 1 & 0 & 0 & 0 \end{pmatrix}$$

$$I(3) = \begin{pmatrix} 0 & 0 & 0 & 1 & 0 \\ 0 & 0 & 0 & 0 & 1 \\ 1 & 0 & 0 & 0 & 0 \\ 0 & 1 & 0 & 0 & 0 \\ 0 & 0 & 1 & 0 & 0 \end{pmatrix} \quad I(4) = \begin{pmatrix} 0 & 0 & 0 & 0 & 1 \\ 1 & 0 & 0 & 0 & 0 \\ 0 & 1 & 0 & 0 & 0 \\ 0 & 0 & 1 & 0 & 0 \\ 0 & 0 & 0 & 1 & 0 \end{pmatrix}$$

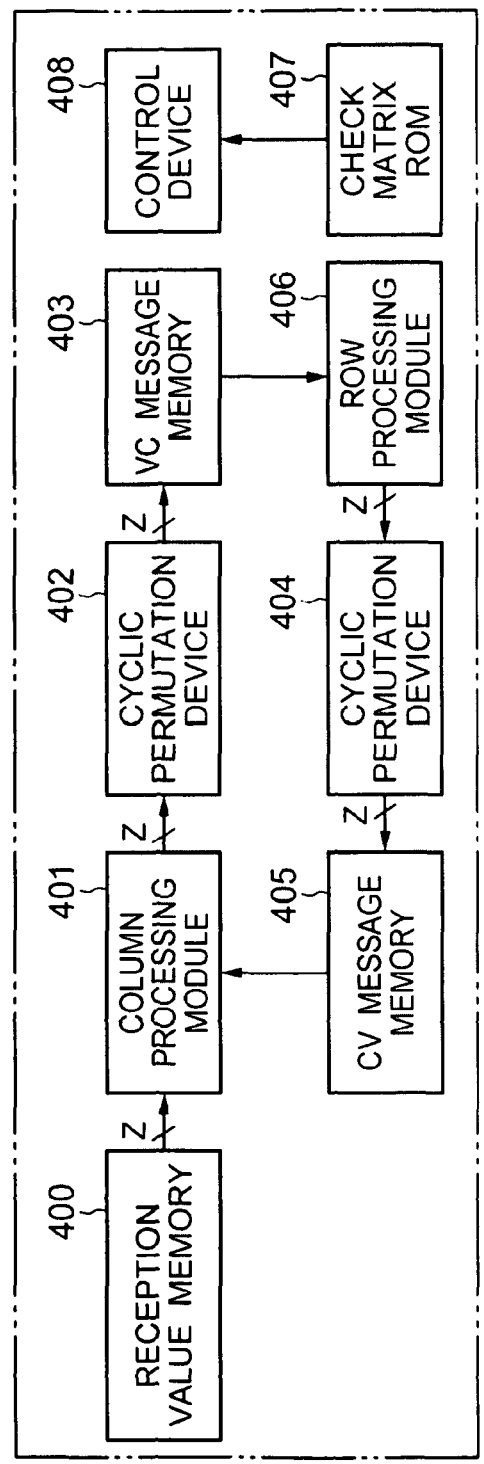

$$H = \begin{pmatrix} I(0) & I(1) & I(2) \\ 0 & I(4) & I(3) \\ I(1) & 0 & I(4) \end{pmatrix}$$

$Z = nS$ (n:INTEGER)

| a(0) | a(1) | a(2) | a(3) | a(4) | a(5) |
|------|------|------|------|------|------|
| a(6) | a(7) | a(8) | a(9) | a(10)| a(11)|
| a(12)| a(13)| a(14)| a(15)| a(16)| a(17)|
|      |      |      |      |      |      |

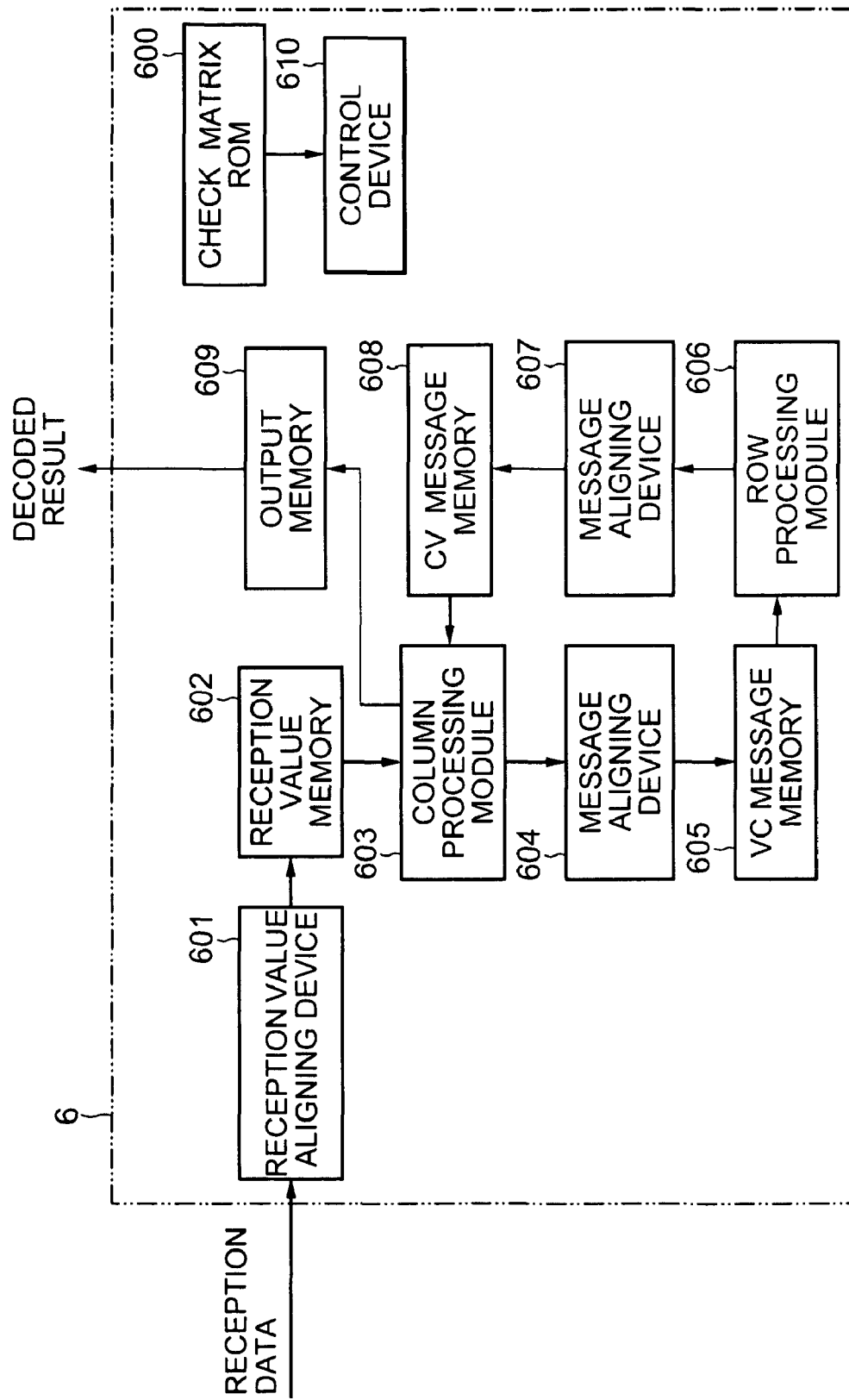

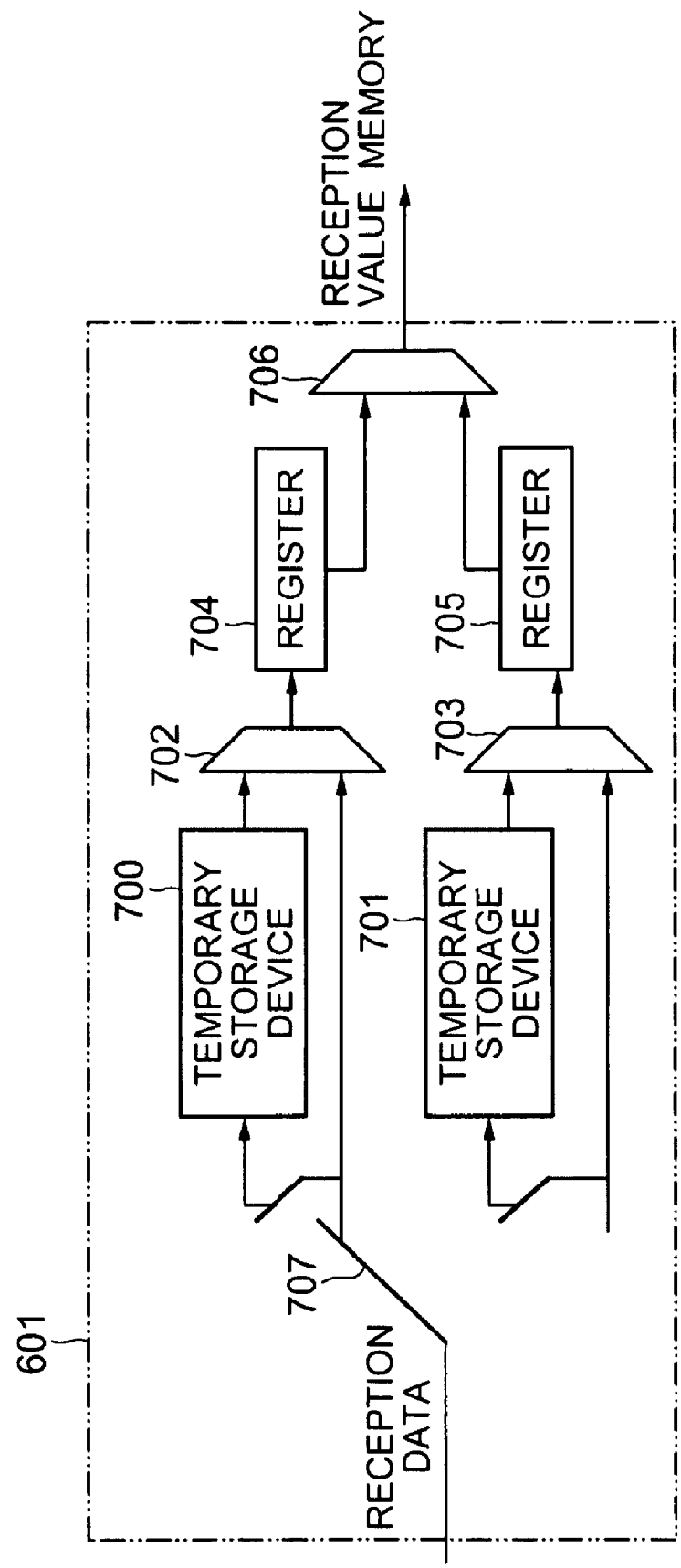

FIG.11A

| a(0) | a(1) | a(2) | a(3) | a(4) | a(5) |
|------|------|------|------|------|------|
| a(6) | a(7) | a(8) | a(9) | a(10)| a(11)|
| a(12)| a(13)| a(14)| a(0) | a(1) | a(2) |

FIG.11B

| a(9) | a(10)| a(11)| a(12)| a(13)| a(14)|
|------|------|------|------|------|------|
| a(0) | a(1) | a(2) | a(3) | a(4) | a(5) |
| a(6) | a(7) | a(8) | a(9) | a(10)| a(11)|

FIG.11C

| a(0) | a(1) | a(2) | | | |
|------|------|------|--|--|--|
| a(3) | a(4) | a(5) | | | |
| a(6) | a(0) | a(1) | | | |

FIG.12A

|  | CYCLE 0 | CYCLE 1 | CYCLE 2 | CYCLE 3 | CYCLE 4 |
|---|---|---|---|---|---|
| INPUT | 0 1 2 3 4 | 5 6 7 8 9 | 10 11 0 12 | | |
| REGISTER 802 | | 0 1 2 3 4 | 0 1 2 3 4 | 5 6 7 8 9 | |
| REGISTER 803 | | | 5 6 7 8 9 | 10 11 0 12 | |
| REGISTER 804 | | 0 1 2 3 4 | 0 1 2 3 4 | 0 1 2 3 4 | |
| ADDRESS | | | 2 | 0 | 1 |
| OUTPUT REGISTER | | | 1 2 3 4 5 | 3 4 5 6 7 | 8 9 10 11 0 |

GAP PROCESSING (CYCLE 1 – CYCLE 2)

FIG.12B

|  | CYCLE 0 | CYCLE 1 | CYCLE 2 | CYCLE 3 | CYCLE 4 |
|---|---|---|---|---|---|
| INPUT | 0 1 2 3 4 | 5 6 7 8 9 | 10 11 0 12 | | |
| REGISTER 802 | | 0 1 2 3 4 | 5 6 7 8 9 | 10 11 0 12 | |
| REGISTER 803 | | | | 0 1 2 3 4 | |
| REGISTER 804 | | | 0 1 2 3 4 | | |
| ADDRESS | | | 1 | 2 | 0 |
| OUTPUT REGISTER | | | 4 5 6 7 8 | 9 10 11 0 1 | 11 0 1 2 3 |

FIG.13A

| | CYCLE 0 | CYCLE 1 | CYCLE 2 | CYCLE 3 | CYCLE 4 | CYCLE 5 |
|---|---|---|---|---|---|---|
| INPUT | 5 6 7 8 9 | 10 11 0 1 2 | 0 1 2 3 4 | | | |
| REGISTER 902 | | | 5 6 7 8 9 | 0 1 2 3 4 | 5 6 7 8 9 | |
| REGISTER 903 | | 5 6 7 8 9 | 10 11 0 1 2 | 5 6 7 8 9 | 10 11 0 1 2 | |
| REGISTER 904 | | | 5 6 7 8 9 | 10 11 0 1 2 | | |
| REGISTER 905 | | | 10 11 0 1 2 | | | |
| OUTPUT REGISTER | | | | 9 10 11 0 1 | 2 3 4 5 6 | 7 8 9 10 11 |

FIG.13B

| | CYCLE 0 | CYCLE 1 | CYCLE 2 | CYCLE 3 | CYCLE 4 | CYCLE 5 |
|---|---|---|---|---|---|---|
| INPUT | 10 11 0 1 2 | 0 1 2 3 4 | 5 6 7 8 9 | 0 1 2 3 4 | 5 6 7 8 9 | |
| REGISTER 903 | | 10 11 0 1 2 | 10 11 0 1 2 | 5 6 7 8 9 | 10 11 0 1 2 | |
| REGISTER 904 | | | 0 1 2 3 4 | 10 11 0 1 2 | 0 1 2 3 4 | |
| REGISTER 905 | | 10 11 0 1 2 | 0 1 2 3 4 | 0 1 2 3 4 | | |
| OUTPUT REGISTER | | | | 11 0 1 2 3 | 4 5 6 7 8 | 9 10 11 0 1 |

DECODING DEVICE AND DECODING METHOD

This Application is the National Phase of PCT/JP2007/073466, filed Dec. 5, 2007, which claims the Priority right based on JP 2006-330924 filed on Dec. 7, 2006, and the disclosure thereof is hereby incorporated by reference in its entirety.

TECHNICAL FIELD

The present invention relates to error correction coding and decoding processing and, more specifically, to a decoding device used for low-density parity-check codes (simply referred to as LDPC codes hereinafter).

BACKGROUND ART

"Error correction code" is a technique which reduces influences of noises during data transmission through performing processing such as coding and decoding. Coding is processing which adds redundancy to data to be transmitted, and the coded data is called a codeword. The codeword sent out to a communication path is affected by a noise. Thus, when the codeword is received, there is such an error generated that the bit of a part of the codeword is inverted. Decoding is processing which restores the data from the received word affected by the error through utilizing the redundancy.

The LDPC codes are error correction codes proposed in 1960s. It has been pointed out that the LDPC codes have an association with respect to turbo codes, and the LDPC codes came to draw attentions in the late 1990s (see Non-Patent Document 1, for example).

With the error correction codes, decoding processing that is estimation processing becomes complicated than that of coding processing. Particularly, in order to achieve a decoding performance of a most likelihood decode or close to that with codes of a large code length exhibiting a high correcting capacity, it is normally necessary to perform extremely complicated processing.

The LDPC codes are characterized to be sparse and have a parity-check matrix with a small number of small loops when expressed in Tanner graph. Based on this characteristic, there is achieved a high-performance decoding method with a relatively high efficiency. This method is called a message-passing decoding (simply referred to as MP decoding hereinafter).

Hereinafter, the MP decoding of the LDPC codes will be described. For simplification, it is assumed here that: the codes are binary codes; the modulation method is BPSK (binary phase shift keying); and soft judgment values correspond to reception values ("+1" for bit 0 of the codeword and "−1" for bit 1), when noise is 0.

The MP decoding method of the LDPC codes is executed by repeatedly updating an amount called a "message" allotted to a component "1" of the parity-check matrix through performing column processing for the columns of the parity-check matrix and performing row processing for the rows thereof. There are two kinds of messages (one from the row processing to the column processing, and one from the column processing to the row processing). Those messages are sometimes called a CV message and a VC message, respectively.

FIG. 1 is a schematic illustration of the MP decoding of the LDPC codes. The message-passing decoding will be described hereinafter by referring to FIG. 1.

It is assumed that a reception value of a codeword bit corresponding to a column i is r(i), and r(i) is expressed in a logarithm likelihood ratio. The column processing is executed by using r(i) and CV messages from the rows on that row, which have a component "1". Here, the number (called an order) of "1" in the column i is "3", the rows having the component "1" are expressed as i(0), i(1), and i(2), and the messages to the column i are expressed as cv(i(0),i), cv(i(1),i), - - - , cv(i(2),i). In the column processing on the column i, the message vc(i,i(0)) to the row i(0) can be expressed with Expression 1.

$$vc(i,i(0)) \leftarrow r(i)+cv(i(1),i)+cv(i(2),i) \quad \text{(Expression 1)}$$

This also applies to "vc(i,i(1))" and "vc(i,i(2))".

In the meantime, assuming that the columns having the component "1" on a row j (the order is 4) are j(0), j(1), j(2), j(3), and the messages from the column processing to the rows j are vc(j(0),j), - - - , vc(j(3),j), the row j sends out "cv(j,j(1))" expressed with Expression 2 to the column j(1).

$$c(j,j(1)) \leftarrow F(vc(j(0),j),vc(j(2),j),vc(j(3),j)) \quad \text{(Expression 2)}$$

Here, "F" is a function showing the row processing, and sum-product algorithm, min-sum algorithm, and the like are known as the methods thereof. Expression 3 shows the min-sum algorithm.

$$c(j,j(1)) \rightarrow sgn(vc(j(0),j))sgn(vc(j(2),j))sgn(vc(j(3),j)) \cdot \min\{|vc(j(0),j)|,|vc(j(2),j)|,|vc(j(3),j)|\} \quad \text{(Expression 3)}$$

Note here that "sgn(a)" is positive/negative sign (+1 or −1) of "a", |a| is an absolute value of "a", and "min" is a function for selecting the minimum value. Same calculations are employed also for "cv (j,j(0))", "cv (j,j(2)), and "cv (j,j(3))".

With the LDPC codes, the orders of rows and columns are small even with a large code length. Thus, the processing of Expression 1 and Expression 2 is not so complicated.

A unit of the processing for executing Expression 1 and Expression 2 for all the columns and rows is called herein as "1 iteration processing". Normally, the number of repeating times of the "1 iteration processing" with the LDPC codes is about 10-100 times.

The final judgment of 0 and 1 (hard judgment) in each codeword bit is executed by judging the positive/negative signs in Expression 4.

$$r(i)+cv(i(0),i)+cv(i(1),i)+cv(i(2),i) \quad \text{(Expression 4)}$$

At the point where the result of the hard judgments satisfy all the check nodes or after completing a preset number of iterations, the MP decoding is ended.

It is expected to speed up the processing if a device can be so configured to be able to perform the row processing and the column processing for all the rows and columns of the parity-check matrix simultaneously. However, it is difficult to be achieved since the LDPC codes normally use a long code length (1000 or more) Therefore, considered is a partial parallel decoding which adjusts the device complication degree and the throughput by storing the messages in a memory and operating a part of the rows and a part of the columns in parallel through sharing a circuit. For implementing a partial parallel decoder of the LDPC codes, there is an issue of making accesses to the memory.

In order to achieve high throughput, it is desirable to employ a code having a parity-check matrix with which easy access to the memory can be expected in the first place. Quasi-cyclic LDPC codes are known as the LDPC codes having such structure.

A typical configuring method of the quasi-cyclic LDPC codes is a method which configures a parity-check matrix by having a same-size cyclic permutation matrix or zero matrix as a block. With such configuring method, it is possible to achieve various code lengths in the quasi-cyclic LDPC codes with a same code structure through changing the size of the block, which is suited for an application for mobile environments, for example, in which the flexibility of the code lengths is required. A matrix generated by allotting "1" to the block of the cyclic permutation matrix and "0" to the zero matrix of the parity-check matrix of the quasi-cyclic LDPC codes is called a "base matrix". Provided that the size of the base matrix is "J×K" and the size of the block of the cyclic permutation matrix is "Z", the parity-check matrix is a matrix of "JK×KZ". FIG. 2 shows an example of the parity-check matrix of the quasi-cyclic LDPC codes in which J=2, K=3, and Z=5. "I(j)" shows a matrix obtained by shifting each row of the unit matrix of size Z to the right side by an amount of "j". This "j" is called an offset value.

The offset value designates switching the order of the messages between a column processing module and a row processing module in the MP decoding. For example, it is assumed here that VC messages corresponding to the block in the upper section of a parity-check matrix H (Z=5) are a(0), a(1), a(2), a(3), and a(4). In this case, those messages can be corresponded to the block in order from the head in the row block through switching the order to a(1), a(2), a(3), a(4), and a(0) based on the offset value 1 in the block.

In the partial decoding processing of the quasi-cyclic LDPC codes, a product of "column block parallel degree" as well as "row block parallel degree" showing how many blocks of the cyclic permutation matrix in the parity-check matrix are to be processed in parallel in the column processing and the row processing and "in-block parallel degree" which is the number of column processing or the row processing executed simultaneously within a block is the index of the entire parallel degree. It is the latter (the in-block parallel degree) to which the present invention pays attention. FIG. 3 shows a relation between the size Z of the block in the parity-check matrix and the in-block parallel degree S. Z-number of messages correspond to the block corresponding to the cyclic permutation matrix, and it is necessary to input and output the Z-number of messages by the records in a unit of S-number in order to achieve the in-block parallel degree S. That is, if the offset value is j, it is necessary to change the order of the VC messages a(0), a(1), - - - , a(Z−1) to a(j), a(j+1), - - - , a(Z−1), a(0), - - - a(j−1))efficiently with input and output in the unit of S.

The simplest case is when S=Z, and it is depicted in Patent Document 1. FIG. 4 shows the method depicted in Patent Document 1. FIG. 4A shows a parity-check matrix, FIG. 4B shows a memory format when S=Z=6, and FIG. 4C shows a decoding device structure. In FIG. 4B, a(0), - - - , a(5) indicate reception values corresponding to one block or a format of CV messages, which configure one record. In FIG. 4C, a reception value memory 400, a VC message memory 403, and a CV message memory 405 all perform input and output by a unit of record in size Z. Z-number of processors are prepared respectively for performing the column processing and the row processing on one-column block or one-row block to configure a column processing module 401 and a row processing module 406. A cyclic permutation device 404 is provided between the vc message memory 402 and the column processing module 401 to perform cyclic permutation according to an offset value so as to rearrange the messages in order of the row direction from the order of the column direction. This offset value is set by a check matrix ROM 407 and a control device 408. The cyclic permutation device 404 performs inverse conversion of the cyclic permutation device 402.

The method of Patent Document 1 is an extremely direct method. However, it is a method which operates only when the in-block parallel degree S is equal to the block size Z. Methods depicted in Patent Document 2 and Non-Patent Document 2 can naturally be employed under a condition where Z is larger than S and Z is a multiple of S. FIG. 5A shows a parity-check matrix, FIG. 5B shows a memory format when Z=18 and S=6, and FIG. 5C shows a block diagram of a message aligning device which switches the order of the messages between the column processing module and the VC message memory. This method achieves cyclic permutation processing of size Z with input and output of the record unit by extracting one record from two consecutive records. A register 501 stores a record inputted before one time point. A shift device 503 connects that record to a current input record, and shifts to extract S-number of data (records) in the head. For the offset value j, "j mod S" corresponds to a shift value. A register 500 stores a first input record of the block, and completes a final output record together with the last input record of the block.

Patent Document 1: Japanese Patent Application Publication 2004-531972
Patent Document 2: US Patent Application Publication 2004/0034828
Non-Patent Document 1: C. J. C. Macky and R. M. Neal, "Good error correcting codes based on very sparse matrices", US, IEEE Transactions on Information Theory, Vol. 45, No. 2, pp. 399-431, March, 1999
Non-Patent Document 2: Y. Chen and D. Hocevar, "A FPGA and ASIC Implementation of Rate 1/2, 8088b Irregular Low Density Parity Check Decoder", US, IEEE, Globecom 2003, pp. 113-117, 2003

When used on mobile communications and the like, flexibility in the code length is required. Thus, it is necessary to correspond to an extremely large number of block sizes Z. When "Z" is not a multiple of "S", the last record of a block is not completed. For example, when Z=16 in FIG. 5C, the data of the last record of the block are a(12), a(13), a(14), and a(15), and spaces of the remainders a(16) and a(17) are uncertain. In Non-Patent Document 2, it is described that this case can be dealt by setting dummy data to the remaining part and conducting a control carefully before and after the last record. However, when extracting a record of a(11), a(12), a(13), a(14), a(15), and a(0), for example this record cannot be generated from continuous two records (a(6), - - - , a(11)) and (a(12), a(13), a(14), a(15), ?, ?). Thus, it is not possible to deal with this with the device of FIG. 5C. Surely, it is possible to generate an output from three records. However, it leads to increase the device complication degree. Further, it is also considered to perform processing with Z/2 in-block parallel degree, in a case of being applied to mobile communications or the like where Z is variable and Z that is smaller than 2S is being set. However, the shift device of FIG. 5C cannot correspond to such case.

It is therefore an object of the present invention to provide a decoder structure that is capable of efficiently dealing with various Z, even when an in-block parallel degree is fixed in MP decoding of quasi-cyclic LDPC codes.

DISCLOSURE OF THE INVENTION

The decoding device of the present invention is a message-passing decoding device for decoding quasi cyclic low-density parity-check codes having a parity-check matrix that includes a same-size cyclic permutation matrix or zero matrix as a block, with decoding parallel processing degree S within the block. The decoding device includes: a reception value aligning device which keeps reception value data received from communication paths of equal to or less than S-number from a head of the block, adds (S−(Z mod S))-number of data from the head of the block to an end of the reception value data of the block to be a multiple of S when size Z of the block is not a multiple of S, and writes the obtained data to a reception value memory; a column processing module configured with S-number of column processing devices for generating messages by performing column processing of the message-passing decoding; a row processing module configured with S-number of row processing devices for generating messages by performing row processing of the message-passing decoding; a message memory which stores the messages, and inputs/outputs S-number of messages as one record; and a message aligning device which performs cyclic permutation corresponding to an offset value of the block in a unit of the record between the message memory and the column processing module or the row processing module, adds (S−(Z mod S))-number of messages from the head of an output of the block to an end of an output message of the block to be a multiple of S when Z is not a multiple of S, and outputs the output message to the message memory (claim 1-claim 7).

With the decoding device described above, the reception value aligning device and the message aligning device can generate the record by adding the head message in a cyclic manner, even when the size Z of the block of the parity-check matrix is not a multiple of the in-block parallel degree S. Therefore, it is possible to generate the output record from the two continuous records at all times.

Thus, even when Z of the block of the cyclic permutation matrix is not a multiple of the in-block parallel degree S, it is possible to change the order of the messages between the column processing module and the row processing module efficiently.

In the decoding device described above, the reception value memory and the message memory may be configured with a plurality of memory devices, respectively (claim 2).

In the decoding device described above, a plurality of the reception value memories, the message memories, the column processing modules, the row processing modules, the message aligning devices may be provided, respectively, by corresponding to parallel processing of a plurality of blocks (claim 3).

In the decoding device described above, the message aligning device may include: a message extracting device which selects S-number of messages from two continuous records; and a plurality of registers for controlling inputs for the message extracting device (claim 4).

The decoding device described above may include a parallel degree determining device which determines the decoding processing parallel degree S within the block according to the size Z of the block of the cyclic permutation matrix (claim 5).

In the decoding device described above, the parallel decree determining device sets the decoding processing parallel degree may be set to a maximum value among candidates of the decoding processing parallel degrees set in advance, the value being equal to or less than ½ of the size S of the cyclic permutation matrix (claim 6).

The decoding device described above, the message extracting device may include: two shift devices which can be individually operated for the two input records; and a selector group which selects output values of the shift devices (claim 7).

The decoding method of the present invention is a message-passing decoding method for decoding quasi cyclic low-density parity-check codes having a parity-check matrix that includes a same-size cyclic permutation matrix or zero matrix as a block, with decoding parallel processing degree S within the block. The decoding method includes: a step which keeps reception value data received from communication paths of equal to or less than S-number from a head of the block, adds (S−(Z mod S))-number of data from the head of the block to an end of the reception value data of the block to be a multiple of S when size Z of the block is not a multiple of S, and writes the obtained data to a reception value memory; and a step which performs cyclic permutation corresponding to an offset value of the block in a unit of record configured with S-number of messages on messages generated by performing column processing or row processing, adds (S (Z mod S)-number of messages from a head of an output of the block to an end of an output message of the block to be a multiple of S when Z is not a multiple of S, and outputs the output message to a message memory (claim 8).

With the decoding method described above, it is possible to generate the record by adding the head message to the reception value data and the message in a cyclic manner, even when the size Z of the block of the parity-check matrix is not a multiple of the in-block parallel degree S. Therefore, the output record can be generated from the two continuous records at all times.

Thus, even when Z of the block of the cyclic permutation matrix is not a multiple of the in-block parallel degree S, it is possible to change the order of the messages between the column processing module and the row processing module efficiently.

An effect of the present invention is that it is possible to change the order of the messages efficiently between the column processing module and the row processing module, even when the size Z of the block of the cyclic permutation matrix is not a multiple of the in-block parallel degree S. This is due to the fact that an output record can be generated from two continuous records at all times since the record is generated by adding the head message in a cyclic manner, even when Z is not a multiple of S.

BEST MODES FOR CARRYING OUT THE INVENTION

Hereinafter, structures and operations of a decoding device 6 as an exemplary embodiment of the invention will be described by referring to the drawings.

FIG. 6 is a block diagram of the decoding device 6. In FIG. 6, a check matrix ROM 600 keeps offset-value information of a cyclic permutation matrix that is a block of a parity-check matrix of quasi-cyclic LDPC codes.

A control device 610 sets offset values stored in the check matrix ROM 600 to message aligning devices 604 and 607. In cases of column block parallel degree and row block parallel degree which perform processing in parallel on all blocks of the parity-check matrix, information from the check matrix ROM 600 and the control device 610 is set to each module in advance. Thus, there are cases where it is not necessary to perform setting processing for the check matrix ROM 600 and setting processing of the offset value to the message aligning devices 604 and 607.

A reception value aligning device 601 writes reception data to a reception value memory 602 by a unit of S-number of records for each block. When Z is not a multiple of S, a record of size S is generated by adding the head data of the block to the last record in a cyclic manner.

The reception value memory 602 is configured with a number of memory blocks corresponding to the column block parallel degree, and the record in a unit of size S is inputted and outputted to/from the reception value memory 602. When S is large, the reception value memory 602 for a single block may be formed by using a plurality of memory devices.

The column processing module 603 is configured with a plurality of column processing devices of MP decoding. In processing of each block, data of the records in a unit of S-number are loaded in order from the reception value memory 602 and a CV message memory 608, and messages to the row processing are generated as the records of a unit of S-number. By having S-number of column processing devices for a single-column block as a single processing unit, a number (corresponding to the column-block parallel degree in the decoder) of such units are prepared.

The message aligning device 604 performs processing for rearranging the VC messages to an order that starts from the column number of the offset value of the block of the cyclic permutation matrix through inputting and outputting records of a unit of S-number. For the last record after rearranging the block, a record of size S is generated and outputted by adding the head message in a cyclic manner. There are the message aligning devices 604 in the number corresponding to the number of blocks whose messages are simultaneously updated.

A VC message memory 605 keeps VC messages in a block unit of the cyclic permutation matrix of the parity-check matrix. The VC message memory 605 also inputs and outputs S-number of data as one record. When Z is not a multiple of S, the last record is kept as a record of size S by adding the head data of the block. The VC message memory 605 is configured with the same number of memory blocks as the number of the message aligning devices 604. As in the case of the reception value memory 602, there are cases where the VC message memory 605 is configured with a plurality of memory devices.

A row processing module 606 loads data from the VC message memory, and generates CV messages. By having S-number of column processing devices for one row block, there are the row processing modules 606 prepared in the number corresponding to the row block parallel degree.

The message realigning device 607 is a circuit which performs inverted conversions of the message aligning device 604, which performs processing for rearranging the order of messages of the row direction to the order of the column direction. As the last record after rearranging the block, the message realigning device 607 generates and outputs the record of size S by adding the head message in a cyclic manner. There are the message aligning devices 607 prepared in the number corresponding to the number of blocks whose messages are simultaneously updated.

A CV message memory 608 keeps CV messages. The CV message memory 608 also inputs and outputs S-number of data as one record. When Z is not a multiple of S, the last record is kept as a record of size S by adding the head data of the block. The CV message memory 608 is configured with the same number of memory blocks as the number of the message aligning devices 607. As in the case of the reception value memory 602, there are cases where the CV message memory 605 is configured with a plurality of memory devices.

An output memory 609 keeps hard judgment values judged based on Expression 3, and outputs those values.

FIG. 7 shows the structure of the reception value aligning device 601 of the present invention. When the size Z of the block of the cyclic permutation matrix of the parity-check matrix is not a multiple of S, (S−(Z Mod S))-number of data ("Z Mod S" shows a reminder when Z is divided by S as a divisor, which takes values of a system of representatives between 1 and S, both inclusive) in the head of the block are stored in a temporary storage device 700, and the last record of the block is generated by adding the data at last. There is a delay generated accordingly, so that the device is structured by duplicating a temporary storage device 701, a selector 703, and a register 705 so as to deal with the delay by performing switching with a switch 706 and a selector 707. The processing performed by the message aligning device 604 is roughly classified into message extracting processing which extracts single record from two continuous records, processing for generating the two continuous records, and message supply processing which performs such controls according to the offset value.

Further, the message aligning device 604 may be formed in a different structure depending on the scheduling of the row processing and column processing of the MP decoding, and there are roughly two kinds:

(A) After the whole column processing and message aligning processing of one block is completed, row processing for that block is started.

(B) The column processing and row processing is executed in such a manner that the row processing of a unit of S-number can be conducted successively.

(B) is required in a method called serial decoding processing or layered decoding processing, which immediately utilizes the messages updated in the row processing within that iteration. Such scheduling increases the update speed of the messages, so that it is possible to speed up to complete repeated decoding. However, the controls thereof become complicated.

FIG. 8 shows the structures of the message aligning devices 604 and 607 for implementing the processing (A). A control device 800 supplies two continuous records to a message extracting device 801 by controlling registers 802, 803, 804 and selectors 807, 808, and 809 according to the offset value. The register 804 stores the head input data of the block, and utilizes it to generate a final output record. The message extracting device 801 extracts two records (i.e., extracts S-number of messages from 2S-number of messages) based on an instruction from the control device 800, and outputs the extracted messages. The control device 800 also outputs an address (=record number (in-block relative value)) of the VC message memory 608 or the CV message memory 605 to which the outputted records are written.

FIG. 9 shows the structures of the message aligning devices 604 and 607 for implementing the processing (B). A difference with respect to the processing (A) is that the order is not continuous even in the middle of the processing within one block since the order of the input data is adjusted according to the offset value. More precisely, the last record and the head record having duplicated messages are to be the input records. In order to be able to generate the outputs continuously even if there is a gap in the arrangements of the messages, registers 902 and 903 keep input records of two time-points earlier and one time-point earlier, respectively, and a message extracting device 901 at first generates the output by using the continuous two records. Further, the registers 904 and 905 keep two input records of the head of the block. With the message aligning device of FIG. 9, start of the output is delayed by one time-point compared to that of FIG. 8. However, through performing such careful control, it becomes possible to set the continuous input records which can be generated and outputted to the message extracting device for an arbitrary offset value and to generate the output records.

FIG. 10 is a parallel degree adaptation setting device 1003 of the exemplary embodiment of the invention, which is capable of changing the in-block parallel degree S appropriately according to Z, when the block size Z is variable. When the block size Z is variable, the parallel degree adaptation setting device 1003 shown in FIG. 10 is provided instead of the check matrix ROM 600 and the control device 610 shown in FIG. 6.

A parallel degree determining device 1000 determines the in-block parallel degree S according to the block size Z. A control device 1001 determines the offset value for the block size Z from a check matrix ROM 1002 and Z. The control device 1001 executes decoding processing by controlling the reception value aligning device 601 and the message aligning devices 604, 607 with Z, S and the offset value.

FIRST EXEMPLARY EMBODIMENT

Hereinafter, the decoding device 6 will be described by using a concretive example. FIG. 11 shows an example of a format of the reception value memory 602 according to the exemplary embodiment of the invention. FIG. 11A shows a case where Z=15 and S=6, and reception value data of a block are expressed as a(0), a(1), - - -, a(14). In this case, the reception value aligning device 601 writes the last record in the block to be in a multiple of S such as (a(12), a(13), a(14), a(0), a(1), a(2)) by adding the head part. The CV message memory 608 has a similar format.

With respect to FIG. 11A, FIG. 11B is a format of messages in the CV message memory 605 when the offset value j=9. The last record is in a form to which a(9), a(10), and a(11) are added in a cyclic manner.

The parallel degree determining device 1000 determines the in-block parallel degree according to the parallel degree S and the block size Z. At that time, typically, the in-lock parallel degree is set to Z/2 or the maximum value among preset values that are smaller than Z/2. FIG. 11C shows a format of the reception value memory 602 when Z=7 and S=3 (S max=6). In an actual implementation, it is effective to set S to be a power of 2 for simplification.

Next, operations of the decoding device 6 will be described by referring to a concretive example (S=5, Z=12).

It is assumed here that the received data for a given column block are a(0), - - -, a(11) in the reception value aligning device 601 of FIG. 7. The received data are written to the reception value memory 602 every time "S=5" pieces of data are kept in the register 704. The temporary storage device 700 keeps "(S−(Z Mod S))=3" pieces of front data a(0), a(1), and a(2). Note here that "Mod S" is a value from 1 to S having S as a divisor. For the last record, while data of a(10) and a(11) are held in the register 704, the data are written to the reception value memory 602 after adding a(0), a(1), and a(2) of the temporary storage device 700. Input data corresponding to a next column block during that time are stored in the register 705 and the temporary storage device 701, and those are alternately utilized to supplement the data in a cyclic manner. Thereby, the record of S-number unit in such form can be obtained.

Next, a concretive operation example of the message aligning device 604 shown in FIG. 8 will be descried. In the column processing module 603, the VC messages for the block are generated in order of R__0=(0, 1, 2, 3, 4) R__1=(5, 6, 7, 8, 9) R__2=(10, 11, 0, 1, 2) (the numerical values show indexes of the messages in the column direction within the block), when Z=12 and S=5. For such input, the message aligning device 604 generates and outputs three records of T__0=(3, 4, 5, 6, 7) T__1=(8, 9, 10, 11, 0) T__2=(1, 2, 3, 4, 5), when j=3 (in any output order). FIG. 12A shows a time chart when implementing this by utilizing the circuit shown in FIG. 8.

It is assumed here that the number of records in one block is e (e=[(Z+S−1)/S], Z is equal to or larger than 2S, and [x] indicates an integer part of x). The register 802 keeps an input record R_(t−1) that is one time-point earlier, and generates an output from two records, i.e., the input record R_(t−1) and a current record R_t. However, in a case where Z, S, and j satisfy a condition of Expression 5 and "t−1=[j/S]", the output-side last record T_(e−1) and the head record T__0 starting from j are both generated from R_(t−1) and R_t.

$(Z \bmod S) < (j \bmod S)$ (Expression 5)

Thus, after extracting T_(e−1) by the message extracting device 801, it is so controlled that the register 802 is in hold, the resister 803 keeps R_t, and the message extracting device 801 generates T__0 from the R_(t−1) and R_t at a next cycle. At that time, the value of the register 803 is stored to the register 802, and the input record is stored to the register 803. Expression 5 is called herein a gap generating condition, and the processing thereof is called gap processing. FIG. 12A is a message aligning device time chart (j=3), and cycles 1 and 2 are concretive examples of the gap processing. As can be seen from the processing at cycle 3 of FIG. 12A, the output record can be generated only from (10, 11, 0, 1, 2) and two continuous records that can be obtained by adding data to the last record in a cyclic manner.

When there is no gap generated (i.e., when (Z Mod S) is equal to or larger than (j mod S)), the head record R__0 of the register 804 is shifted to the register 803 at the point where the last record R_(e−1) is inputted. At a next step, the last output record is generated by having the R_(e−1) of the register 802 and R__0 of the register 803 as inputs for the message extracting device 801. FIG. 12B is a message aligning device time chart (j=11), and cycle 3 is a concretive example of the processing thereof. When "Z Mod S" is S (Z is a multiple of S) or "S−1", Expression 5 does not apply. In that case, the same processing as that of the conventional case is to be executed.

An initial value of the address of the output data generated by the control device 800 in the message aligning device of FIG. 8 can be given by Expression 6. The addresses thereafter can be obtained through incrementing it by 1 while having "e" as a divisor.

$(e - [(j + (S - Z \bmod S))/S]) \bmod e$ (Expression 6)

FIG. 13 is an example of a time chart regarding the message aligning device 601 shown in FIG. 9. A difference with respect to that of the message aligning device 601 of FIG. 8 is to generate the records in order of T__0, T__1, - - -, and it is necessary to adjust the order of the messages generated by the column processing module accordingly. At that time, the column processing module generates the messages in order from the record R_i of "i=[j/S]" to R_(i+1), - - -, R_(e−1), R__0, - - -, R_(i−1) for the offset value j, and supplies those to the message aligning device 604.

Registers 902 and 903 respectively keep an input record R(t−2) that is two point earlier with respect to the current input record R_t and an input record R(t−1) that is one time-point earlier. A message extracting device 901 extracts an output record from R_(t−2) and R_(t−1). However, in a case where the input record is R__0 and the registers 902, 903 keep R_(e−2), R(e−1) while Z, S, and j are set to satisfy the gap generating condition of Expression 4, it is necessary to generate the next output not from two records of R_(e−1) and R__0 but from R__0 and R__1. The structure shown in FIG. 9 can deal with that since there is a delay of one extra time-point provided until the output. The input record R__0 is written to the register 902 at that time. Controls are so changed that the register 902 thereafter keeps the input record of one time-point earlier, and that record together with the current input record becomes an input for the message extracting device 901. This processing is also called gap processing as in the case of FIG. 8. After inputting the last record from the column processing module, the head record of the block stored in the registers 904 and 905 is treated as an input record.

The gap processing in FIG. 9 will be described by using a concretive example shown in FIG. 13A. In FIG. 13A, Z=12, S=5, and j=9, so that the gap condition of Expression 5 applies. The records of the messages are supplied to the message aligning device in order of R__1, R__2 and R__0 since "[j/S]=1". R__1 and R__2 are stored to the registers 904 and 905 in order. At the point of cycle 2, R__1 and R__2 are stored in the registers 902 and 903, and the input record is R__0 (e=). At this time, the output record is T__0=(9, 10, 11, 0, 1, 2). The next output T__1=(3, 4, 5, 6, 7) can be generated not from R__2 and R__0 but from R__0 and R__1. With the operations of FIG. 9 described above, R__0 that is the input record is kept in the register 902. Therefore, the data supplied to the message extracting device 901 at cycle 3 are R__0 and R__1 that is stored in the register 904, so that the message extracting device 901 can extract T__1. Further, as can be seen from the processing of cycle 2, it is also possible in this case to generate the output record only from two continuous records, i.e., (10, 11, 0, 1, 2) and the record obtained by adding the head data to the last record in a cyclic manner.

FIG. 13B shows a concretive example of a time chart of the message aligning device shown in FIG. 9, when the gap condition of Expression 5 does not apply (Z=12, S=5, j=11). Particularly, when "Z Mod S" is "S" or "S−1", the gap condition never applies for arbitrary j. Thus, it is possible to decrease the delay by one time-point.

FIG. 14 shows a structural example of the message extracting devices 801 and 901 of FIG. 8 and FIG. 9, which is configured with a left shift device 1400, a right shift device 1401, and a selector group 1402. The control devices 800 and 900 perform desired message extractions by successively changing respective shift values of the left shift device 1400 and the right shift device 1401 as well as selection patterns of the selector group 1402.

A concretive example of the operations of the message extracting devices 801 and 901 shown in FIG. 14 will be described by referring to FIG. 12. The input record for the left shift device 1400 in cycle 2 of FIG. 12A is (0, 1, 2, 3, 4) and the input record for the right shift device 1401 is (5, 6, 7, 8, 9). At this time, the left shift device 1400 performs shifting once and the right shift device 1401 performs shifting four times, and the selector group 1402 performs selections in a pattern of [0, 0, 0, 0, 1] from the left ("0" indicates to select the input from the left shift device 1400, and "1" indicates to select the input from the right shift device 1401). Thereby, the record of (1, 2, 3, 4, 5) can be extracted. When there is gap processing performed, there is a change generated in the control. Thus, the shift values of the left shift device 1400 and the right shift device 1401 at cycle 3 and thereafter become 3 and 2, respectively, and the selection pattern of the selector group 1402 becomes [0, 0, 1, 1, 1] in FIG. 12.

When Z is smaller than 2S, an in-block parallel degree S__0 determined by the parallel degree selecting device shown in FIG. 10 is set. The messages are to be stored only in "S__0"-number of the head records among the records of size S. The message extracting device shown in FIG. 14 performs shift processing individually to the two records to be the inputs to perform selecting processing for each of the outputs of the same position. In this manner, it is possible to deal with such case where "S__0<S" without making any changes in the processing.

With the decoding device 6, the reception value aligning device 601 and the message aligning devices 604, 607 can generate the record by adding the head message in a cyclic manner, even when the size Z of the block of the parity-check matrix is not a multiple of the in-block parallel degree S. Therefore, it is possible to generate the output record from the two continuous records at all times.

Thus, even when Z of the cyclic permutation matrix is not a multiple of S, it is possible to change the order of the messages between the column processing module 603 and the row processing module 606 efficiently. The column processing and the row processing are to be executed in a duplicated manner for the added part. However, the overhead is small if Z is larger than S.

While the present invention has been described by referring to the embodiments (and examples), the present invention is not limited only to those embodiments (and examples) described above. Various kinds of modifications that occur to those skilled in the art can be applied to the structures and details of the present invention within the scope of the present invention.

This Application claims the Priority right based on JP 2006-330924 filed on Dec. 7, 2006, and the disclosure thereof is hereby incorporated by reference in its entirety.

INDUSTRIAL APPLICABILITY

The present invention makes it possible to apply the LDPC codes to the mobile communications and the like in which a high flexibility in the code length is required.

BRIEF DESCRIPTION OF THE DRAWINGS

FIG. 1 is an illustration for describing decoding processing of LDPC codes;

FIG. 4A is an illustration showing an example of the parity-check matrix, FIG. 4B is an illustration showing an example of a memory format, and FIG. 4C is a block diagram of a conventional decoding device;

FIG. 6 is a block diagram of a decoding device as a first exemplary embodiment of the invention;

FIG. 7 is a block diagram of a reception value aligning device;

FIG. 11A, FIG. 11B, and FIG. 11C are illustrations showing format examples of a reception value memory;

FIG. 12A and FIG. 12B are illustrations showing time charts of the message aligning device;

FIG. 13A and FIG. 13B are illustrations showing time charts of the message aligning device.

REFERENCE NUMERALS

Figure 2:
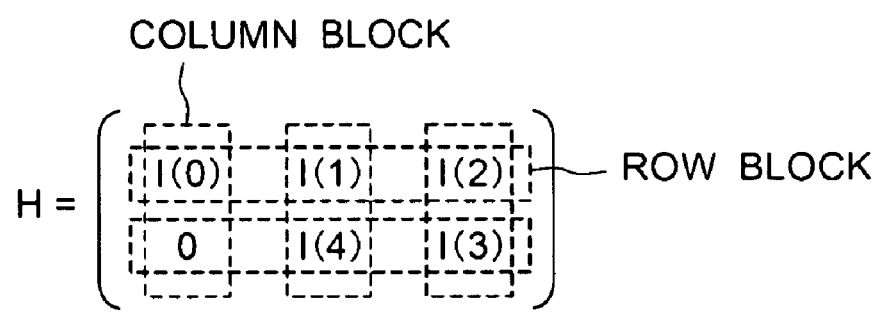
FIG. 2 is an illustration for describing a parity-check matrix of the LDPC codes.
Figure 3:
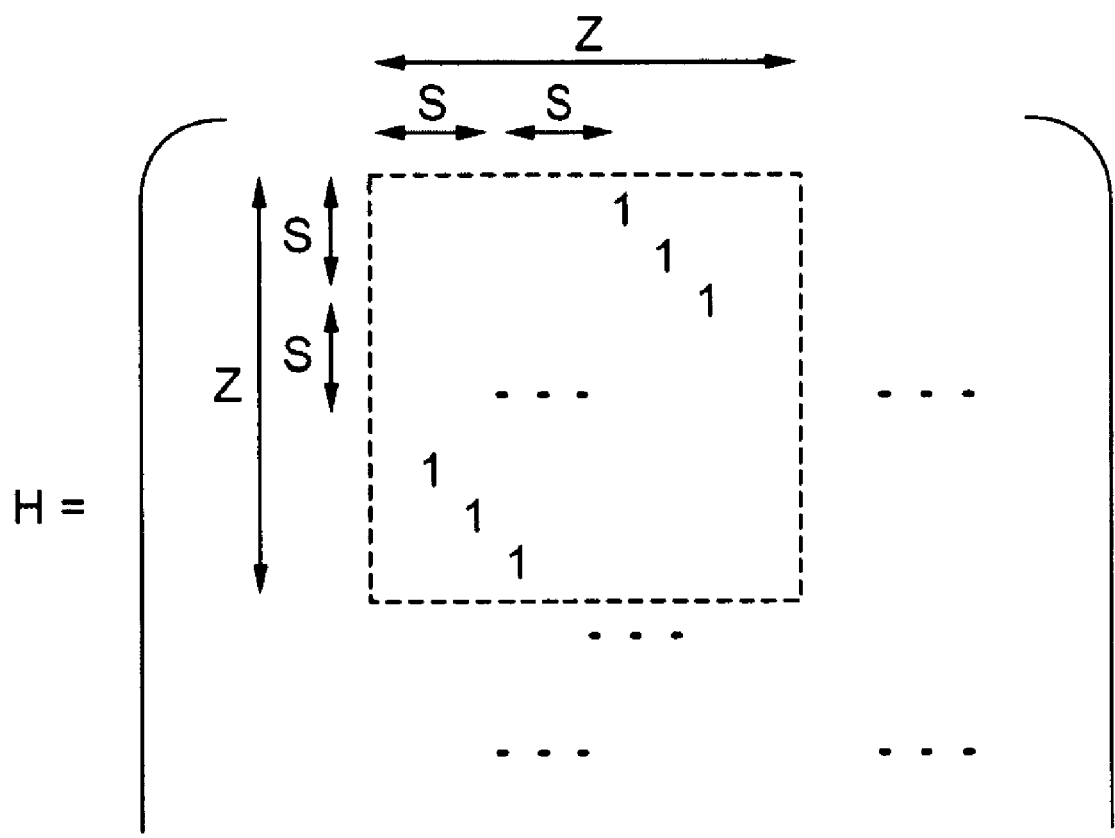
FIG. 3 is an illustration showing a relation between a size of a block and an in-block parallel degree.
Figures 5A, 5B, 5C:
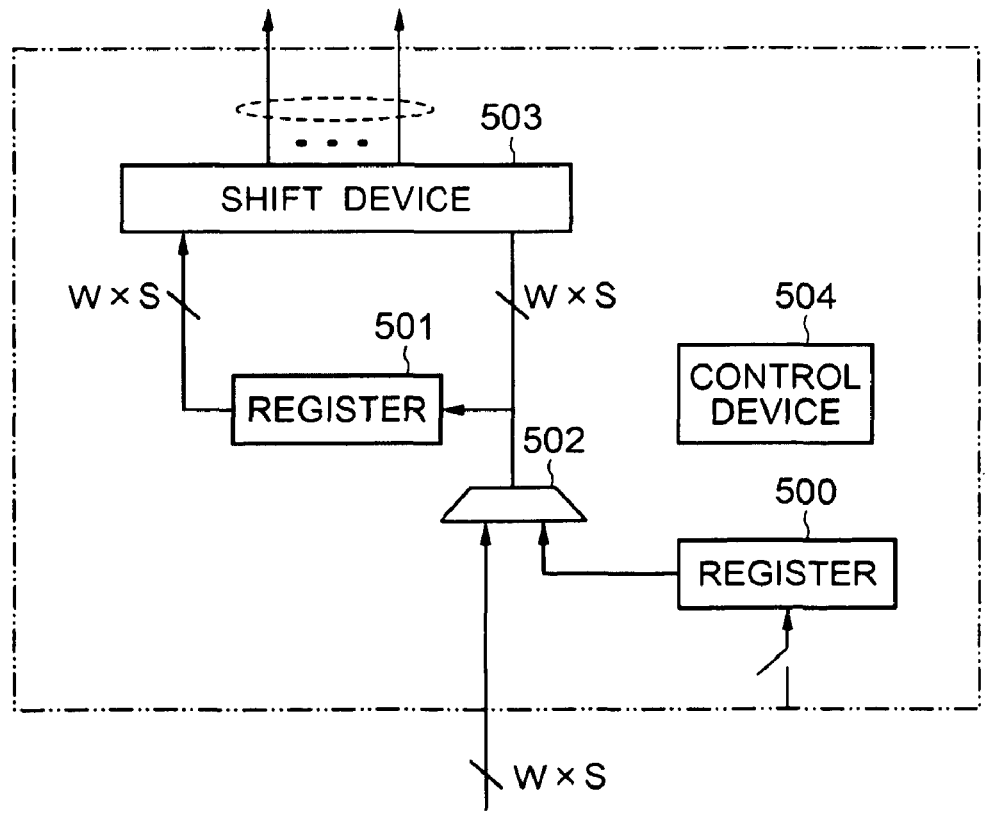
FIG. 5A is an illustration showing an example of the parity-check matrix.
FIG. 5B is an illustration showing an example of a memory format.
FIG. 5C is a block diagram of a conventional message aligning device.
Figure 8:
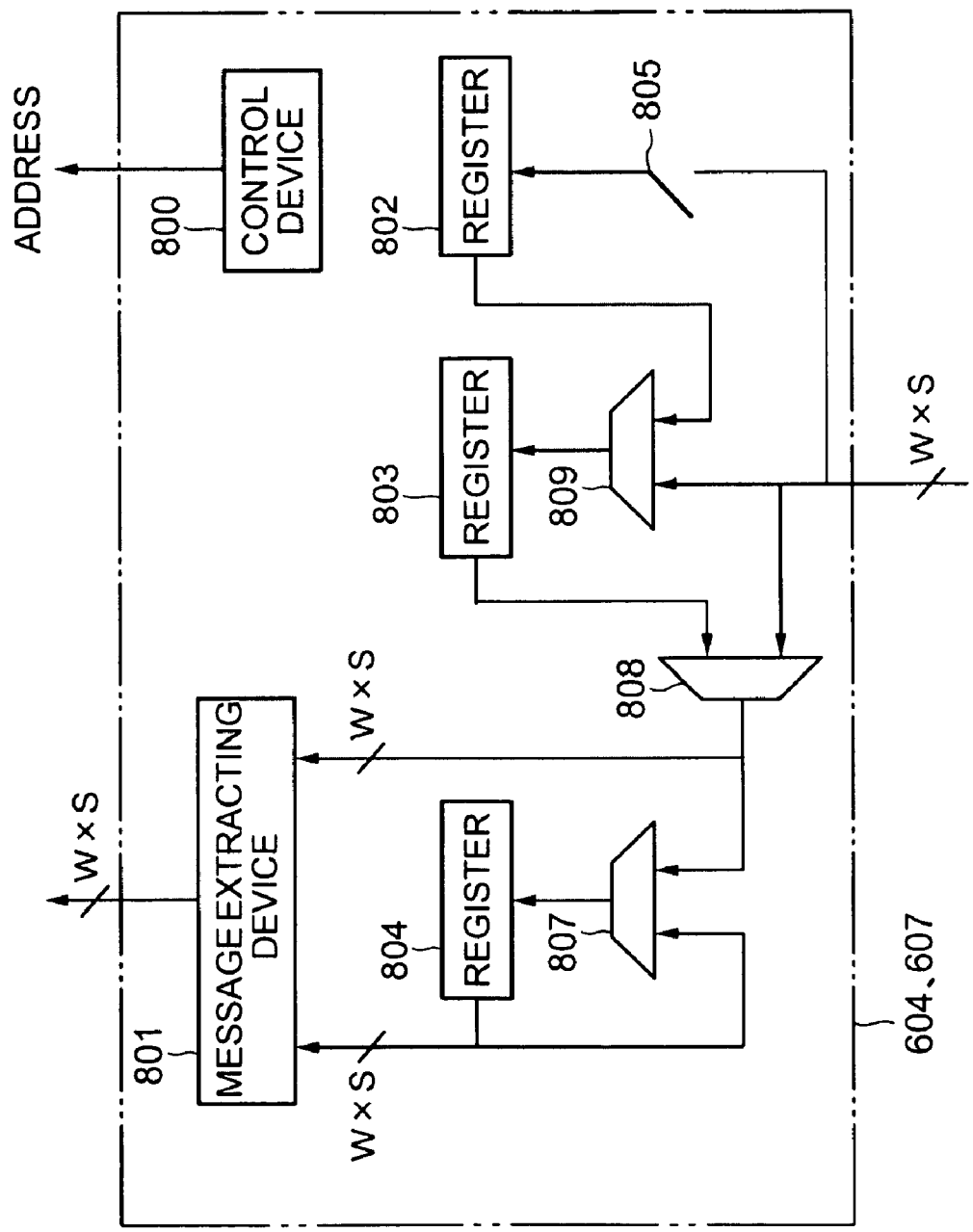
FIG. 8 is a block diagram of a message aligning device.
Figure 9:
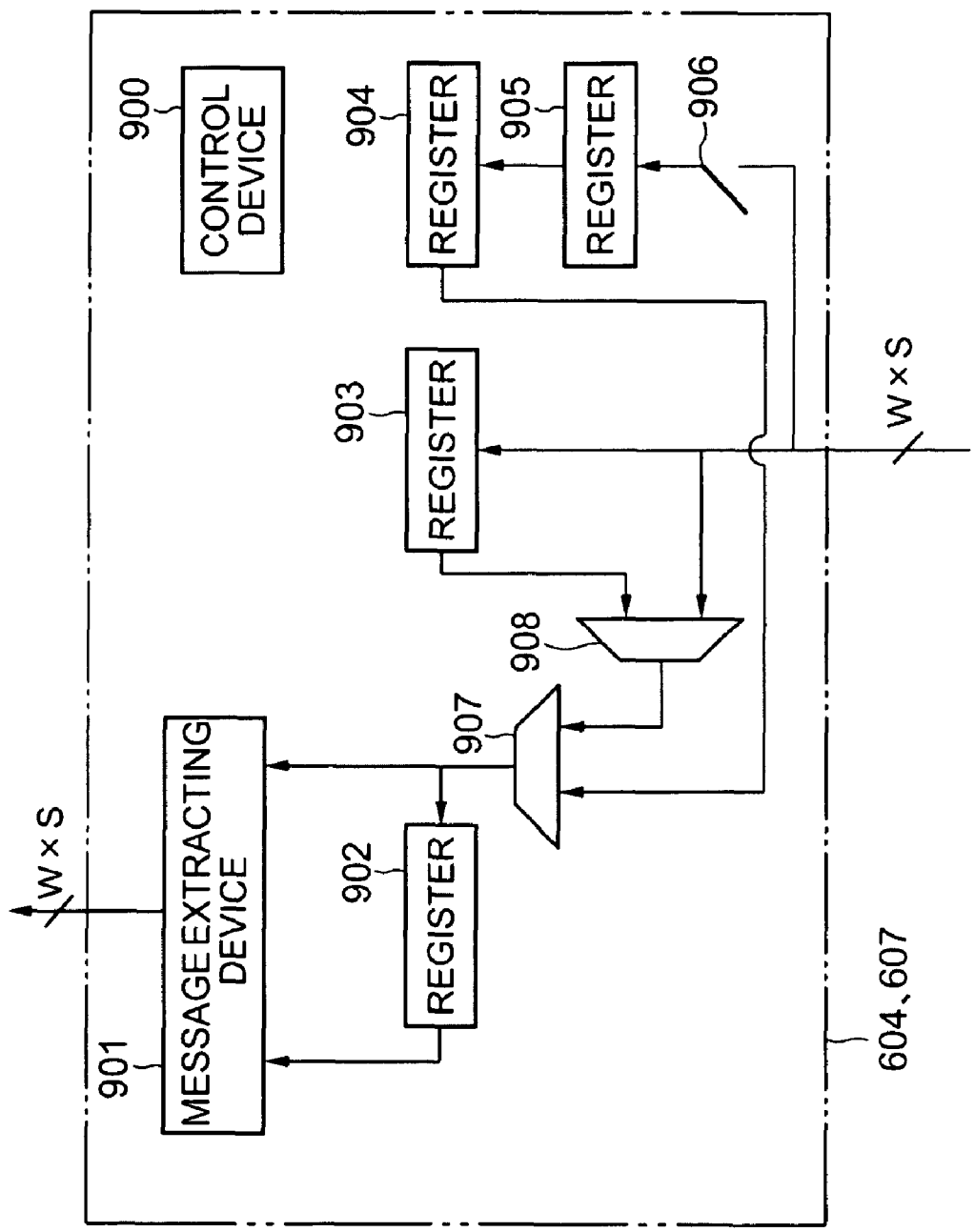
FIG. 9 is a block diagram of a message aligning device.
Figure 10:
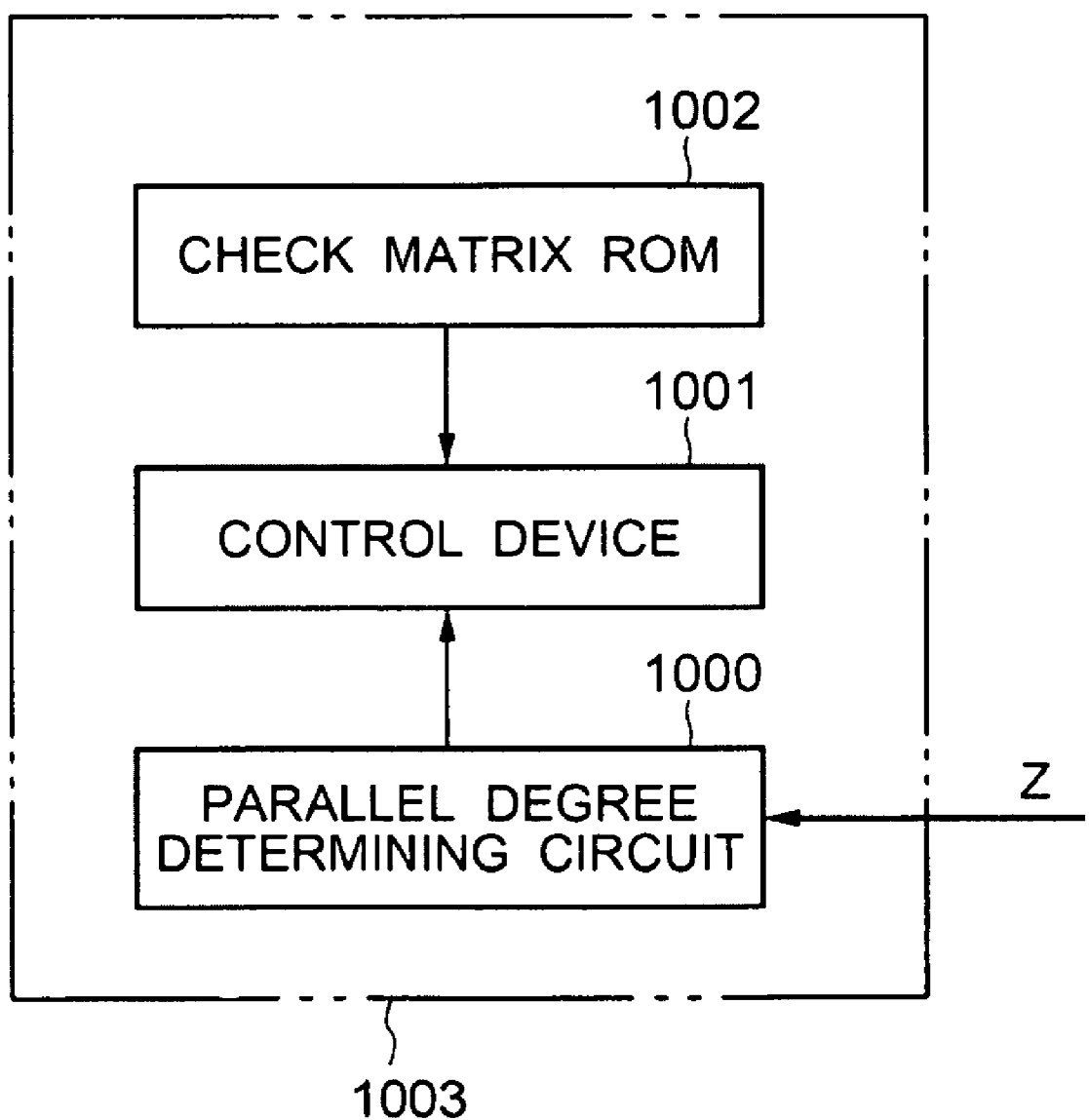
FIG. 10 is a block diagram of a parallel degree adaptation setting device.
Figure 14:
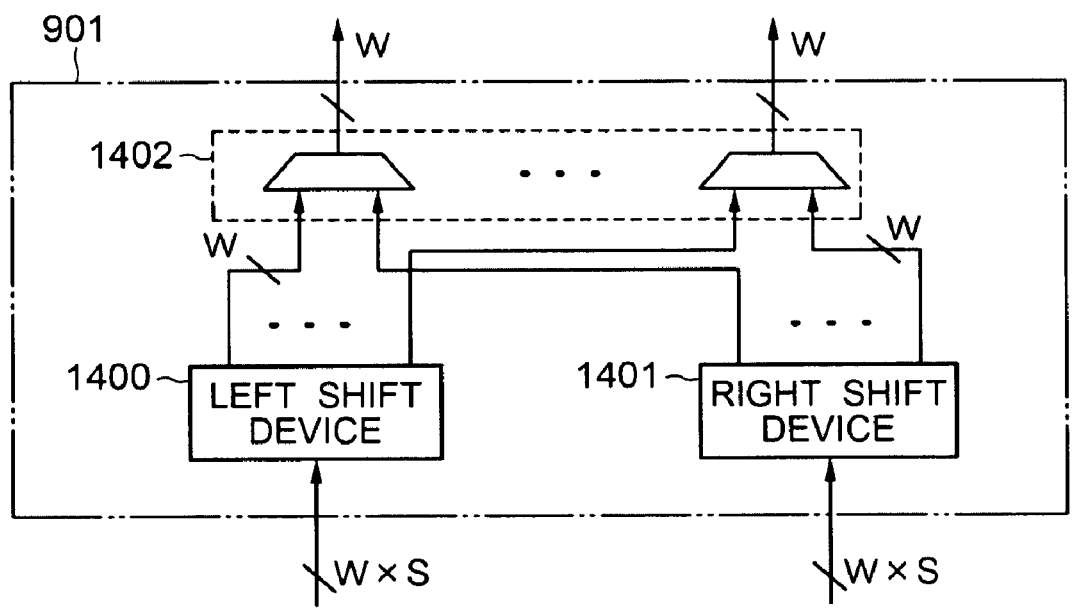
FIG. 14 is a block diagram of a message extracting device.

6 Decoding device
600 Check matrix ROM
601 Reception value aligning device
602 Reception value memory
603 Column processing module
604, 607 Message aligning device
605 VC message memory
606 Row processing module
608 CV message memory
609 Output memory
610 Control device
700, 701 Temporary storage device
704, 705 Register
800 Control device
801 Message extracting device
807, 808, 809 Register
900 Control device
901 Message extracting device
903, 904, 905, 907, 908 Register
1000 Parallel degree determining circuit
1001 Control device
1002 Check matrix ROM

What is claimed is:

1. A message-passing decoding device for decoding quasi cyclic low-density parity-check codes having a parity-check matrix that includes a same-size cyclic permutation matrix or zero matrix as a block, with decoding parallel processing degree S within the block, the device comprising:
   a reception value aligning device which keeps reception value data received from communication paths of equal to or less than S-number from a head of the block, adds (S−(Z mod S))-number pieces of data from the head of the block to an end of the reception value data of the block to be a multiple of S when size Z of the block is not a multiple of S, and writes the obtained data to a reception value memory;
   a column processing module configured with S-number of column processing devices for generating messages by performing column processing of the message-passing decoding;
   a row processing module configured with S-number of row processing devices for generating messages by performing row processing of the message-passing decoding;
   a message memory which stores the messages, and inputs/outputs S-number of messages as one record; and
   a message aligning device which performs cyclic permutation corresponding to an offset value of the block in a unit of the record between the message memory and the column processing module or the row processing module, adds (S−(Z mod S))-number of messages from the head of an output of the block to an end of an output message of the block to be a multiple of S when Z is not a multiple of S, and outputs the output message to the message memory.

2. The decoding device as claimed in claim 1, wherein the reception value memory and the message memory are configured with a plurality of memory devices, respectively.

3. The decoding device as claimed in claim 1, a plurality of the reception value memories, the message memories, the column processing modules, the row processing modules, the message aligning devices are provided, respectively, by corresponding to parallel processing of a plurality of blocks.

4. The decoding device as claimed in claim 1, wherein the message aligning device comprises: a message extracting device which selects S-number of messages from two continuous records; and a plurality of registers for controlling inputs for the message extracting device.

5. The decoding device as claimed in claim 4, wherein the message extracting device comprises: two shift devices which can be individually operated for the two input records; and a selector group which selects output values of the shift devices.

6. The decoding device as claimed in claim 1, comprising a parallel degree determining device which determines the decoding processing parallel degree S within the block according to the size Z of the block of the cyclic permutation matrix.

7. The decoding device as claimed in claim 6, wherein the parallel decree determining device sets the decoding processing parallel degree to a maximum value among candidates of the decoding processing parallel degrees set in advance, the value being equal to or less than ½ of the size S of the cyclic permutation matrix.

8. A message-passing decoding method for decoding quasi cyclic low-density parity-check codes having a parity-check matrix that includes a same-size cyclic permutation matrix or zero matrix as a block, with decoding parallel processing degree S within the block, the method comprising:
   a step which keeps reception value data received from communication paths of equal to or less than S-number from a head of the block, adds (S−(Z mod S))-number of data from the head of the block to an end of the reception value data of the block to be a multiple of S when size Z of the block is not a multiple of S, and writes the obtained data to a reception value memory; and
   a step which performs cyclic permutation corresponding to an offset value of the block in a unit of record configured with S-number of messages on messages generated by performing column processing or row processing, adds (S−(Z mod S))-number of messages from a head of an output of the block to an end of an output message of the block to be a multiple of S when Z is not a multiple of S, and outputs the output message to a message memory.

9. Message-passing decoding means for decoding quasi cyclic low-density parity-check codes having a parity-check matrix that includes a same-size cyclic permutation matrix or zero matrix as a block, with decoding parallel processing degree S within the block, the device comprising:
   reception value aligning means for keeping reception value data received from communication paths of equal to or less than S-number from a head of the block, adding (S−(Z mod S))-number pieces of data from the head of the block to an end of the reception value data of the block to be a multiple of S when size Z of the block is not a multiple of S, and writing the obtained data to a reception value memory;
   a column processing module configured with S-number of column processing means for generating messages by performing column processing of the message-passing decoding;
   a row processing module configured with S-number of row processing means for generating messages by performing row processing of the message-passing decoding;
   a message memory means for storing the messages, and inputting/outputting S-number of messages as one record; and
   message aligning means for performing cyclic permutation corresponding to an offset value of the block in a unit of the record between the message memory means and the column processing module or the row processing module, adding (S−(Z mod S))-number of messages from the head of an output of the block to an end of an output message of the block to be a multiple of S when Z is not a multiple of S, and outputting the output message to the message memory.

* * * * *